United States Patent [19]
Villani

[11] Patent Number: 5,329,426
[45] Date of Patent: Jul. 12, 1994

[54] CLIP-ON HEAT SINK

[75] Inventor: Angelo Villani, Shrewsbury, Mass.

[73] Assignee: Digital Equipment Corporation, Maynard, Mass.

[21] Appl. No.: 34,995

[22] Filed: Mar. 22, 1993

[51] Int. Cl.⁵ .................................. H04K 7/20
[52] U.S. Cl. .............................. 361/719; 24/625; 257/719; 361/704
[58] Field of Search ............ 439/485, 487; 24/457, 24/458, 472, 625; 257/706, 707, 713, 718, 719; 174/16.3; 165/80.3, 185; 267/150, 160; 248/316.7, 505, 510; 361/386, 388, 703, 704, 707, 709, 712, 719, 720, 722, 690, 689

[56] References Cited

U.S. PATENT DOCUMENTS

| | | | |
|---|---|---|---|
| 4,169,642 | 10/1979 | Mouissie | 339/17 |
| 4,345,267 | 8/1982 | Corman et al. | 357/81 |
| 4,405,961 | 9/1983 | Chow et al. | 360/129 |
| 4,448,240 | 5/1984 | Sharon | 165/80 |
| 4,483,389 | 11/1984 | Balderes et al. | 165/80 |
| 4,509,839 | 4/1985 | Lavochkin | 357/81 |
| 4,535,841 | 8/1985 | Kok | 165/185 |
| 4,607,277 | 8/1986 | Hassan et al. | 357/81 |
| 4,639,829 | 1/1987 | Ostergren et al. | 361/386 |
| 4,679,118 | 7/1987 | Johnson | 361/386 |
| 4,712,159 | 12/1987 | Clemens | 361/386 |
| 4,716,494 | 12/1987 | Bright et al. | 361/386 |
| 4,745,456 | 5/1988 | Clemens | 357/79 |
| 4,872,089 | 10/1989 | Ocken | 361/388 |
| 4,878,108 | 10/1989 | Phelps, Jr. et al. | 357/81 |
| 4,888,637 | 12/1989 | Sway-Tin et al. | 357/81 |
| 4,933,746 | 6/1990 | King | 357/81 |
| 4,972,294 | 11/1990 | Moses, Jr. et al. | 361/386 |
| 4,978,638 | 12/1990 | Buller et al. | 437/209 |
| 5,040,096 | 8/1991 | Churchill | 361/386 |
| 5,052,481 | 10/1991 | Horvath et al. | 165/185 |
| 5,065,279 | 11/1991 | Lazenby et al. | 361/386 |
| 5,130,888 | 7/1992 | Moore | 361/386 |
| 5,208,731 | 5/1993 | Blomquist | 361/386 |

Primary Examiner—Gerald P. Tolin
Attorney, Agent, or Firm—Christine M. Kuta; A. Sidney Johnston

[57] ABSTRACT

A clip-on heat sink assembly includes a spring and electrically-insulating braces. The spring is shaped to fit over a heat sink and a chip carrier package and engage with the braces which support the chip carrier package. The spring holds the heat sink in place and forces the heat sink and the chip carrier package together in order to maintain good thermal contact. An alternative embodiment includes a spring with the braces attached to form one piece.

11 Claims, 5 Drawing Sheets

CLIP-ON HEAT SINK

FIELD OF THE INVENTION

The present invention relates, in general, to cooling heat-generating devices and more particularly to attaching heat sinks to heat-generating electronic components.

BACKGROUND OF THE INVENTION

A semiconductor device in operation generates heat which must be dissipated in order to prevent damage to the device. Generally, the heat is dissipated by means of a heat sink. The heat sink must be attached to the semiconductor device so that thermal resistivity between the heat sink and the device is minimized, and this condition must be maintained despite vibration and shock to the assembly. The heat sink should also be attached removably so that the chip carrier package may be replaced or the substrate repaired, if necessary. It is a problem to attach heat sinks to semiconductor devices quickly, simply and removably without damaging the fragile ceramic packages which contain the semiconductor chips.

One technique for attaching a heat sink to a semiconductor device is the stud and nut approach where a slug is brazed to the back of a ceramic chip carrier and two threaded studs are brazed onto the slug. The heat sink, which has holes drilled into it, is inserted over the studs and fastened down with nuts. This method is expensive because of the number and complexity of pieces involved. This method is also time-consuming to assemble because of the number of steps involved and the time needed to align the heat sink on the stud and to tighten the nut down.

In another method for attaching a heat sink, a plastic frame has openings to accept pins of the chip carrier, and a spring clips around the frame to hold the heat sink onto the chip carrier, as shown for example in U.S. Pat. No. 4,716,494, issued to E. J. Bright, et al. on Dec. 29, 1987.

A further example of a heat sink attachment method is to first place a plastic frame between the chip and the board, then insert the chip carrier and then snap a spring over the frame. Such a method is shown in U.S. Pat. No. 4,745,456 issued to D. L. Clemens on May 17, 1988.

It remains desirable to find a quick and simple method for attaching a heat sink to a chip carrier that maintains good thermal contact, does not damage the chip carrier and may be assembled or disassembled at any time.

SUMMARY OF THE INVENTION

The problems of damaging ceramic chip carriers during the attachment of heat sinks and of time-consuming and costly assembly of heat sinks to chip carriers on substrates are solved by the present invention of a clip-on heat sink. The clip-on heat sink has a spring shaped to fit over a heat sink and a chip carrier package and a first brace and a second brace supporting the chip carrier package and providing a means to engage the spring. The spring holds the heat sink in place and forces the heat sink and chip carrier package together in order to minimize thermal resistivity between the heat sink and the chip carrier package.

Other and further aspects of the present invention will become apparent during the course of the following description and by reference to the accompanying drawings.

BRIEF DESCRIPTION OF THE DRAWINGS

Referring now to the drawings, in which like numerals represent like parts in the several views.

DETAILED DESCRIPTION

Figure 1:
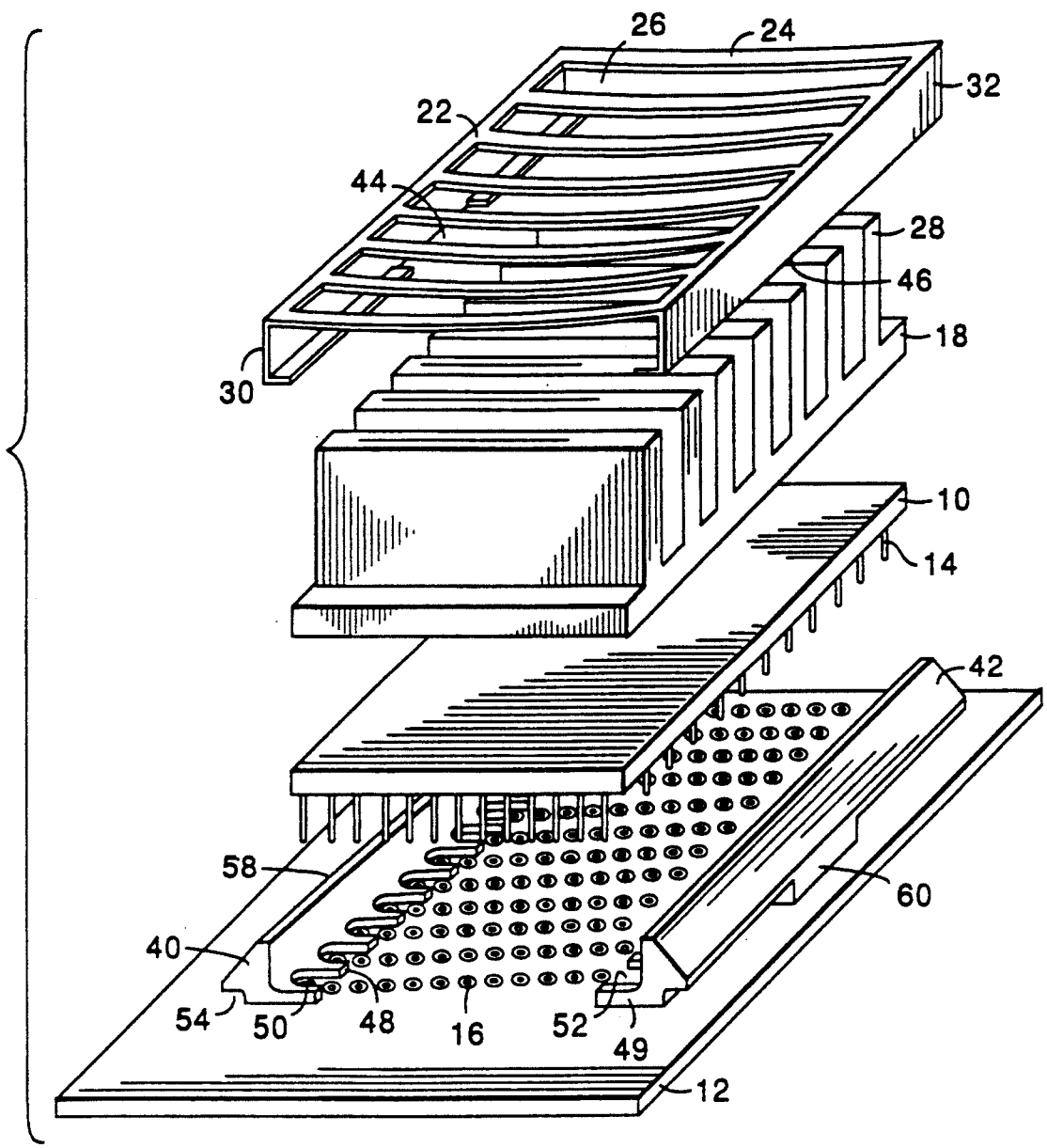
FIG. 1 is a perspective exploded view of a heat sink assembly.

FIG. 1 shows a chip carrier package 10 to be mounted on a substrate 12, such as a printed wiring board or a multi-chip module, by pins 14 in vias 16. The chip carrier package 10 may also be surface mounted to the substrate 12. In operation, the chip carrier package 10 generates heat which must be removed by a heat sink 18. The heat sink 18 is attached by means of a clip-on heat sink apparatus.

The clip-on heat sink apparatus includes a spring 22 to attach the heat sink 18 to the chip carrier package 10. The spring 22 is generally U-shaped with a top 24 which is generally concave. The top 24 has a plurality of slots 26 to receive a plurality of fins 28 of the heat sink 18. The spring 22 has two sides 30, 32 which are dimensioned to fit over the heat sink 18 and to engage with a first and a second brace 40, 42 supporting the chip carrier package 10. Each of the sides 30, 32 of the spring 22 has a gap 44, 46, as further illustrated in FIG. 5, to engage with the first and second brace 40, 42 supporting the chip carrier package 10. The spring 22 may be made of metal or of plastic.

The first brace 40 and the second brace 42 are placed on opposite sides of the chip carrier package 10. On the inside of the braces 40, 42 are bottom plates 48, 49 for supporting the chip carrier package 10 while it is mounted on the substrate 12. The bottom plates 48, 49 have cut-outs 50, 52 to accommodate the pins 14 of the chip carrier package 10 and to prohibit slipping in a direction collinear to the braces 40, 42. The braces 40, 42 each have a groove 54, 56 on the outside of the braces 40, 42. The grooves 54, 56 each have a projection 58, 60, as further illustrated in FIG. 6. The projections 58, 60 engage with the spring 22 to prohibit slipping in a direction collinear to the braces 40, 42. The braces 40, 42 are formed from an electrically insulating material, for example, plastic.

Figure 2:
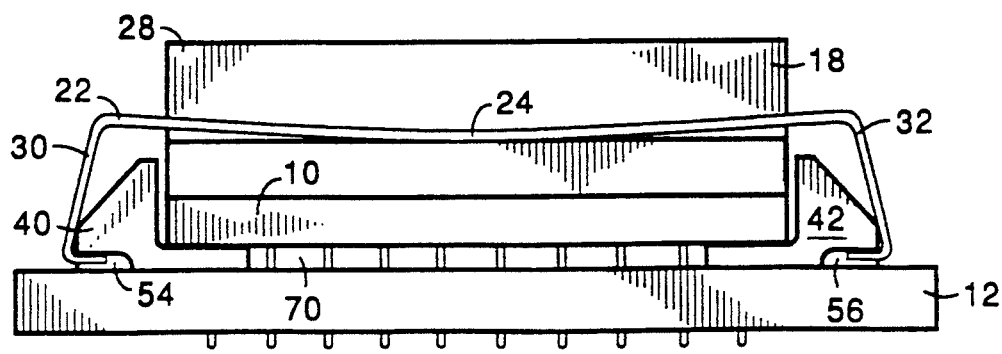
FIG. 2 is a side view of the heat sink assembly.

FIG. 2 is a side view of the clip-on heat sink assembly, the chip carrier package 10, heat sink 18 and substrate 12 of FIG. 1 in assembled condition. The braces 40, 42 are between the chip carrier package 10 and the substrate 12 in the pin stand-off area 70. The braces may be put in place either before the chip carrier package 10 is mounted to the substrate 12 or after. The heat sink 18 is on top of the chip carrier package 10. The spring 22 is over the heat sink 18, the chip carrier package 10, and the braces 40, 42. The fins 28 of the heat sink 18 are received by the slots 26 of the spring 22. The sides 30, 32 of the spring 22 engage with the grooves 54, 56 and the projections 58, 60 in the gaps of the braces 40, 42.

The inwardly concave top 24 of the spring 22 exerts a force on the heat sink 18, the chip carrier package 10 and the braces 40, 42 to minimize the thermal resistivity at the heat sink 18 to chip carrier package 10 interface. The bottom plates 48, 49 support the chip carrier package 10 and distribute the force of the spring 22 to minimize compression at the edges of the chip carrier package 10 and to prevent shear stress on the chip carrier package 10. The spring 22 also prevents any slippage of the heat sink 18.

Figure 3:
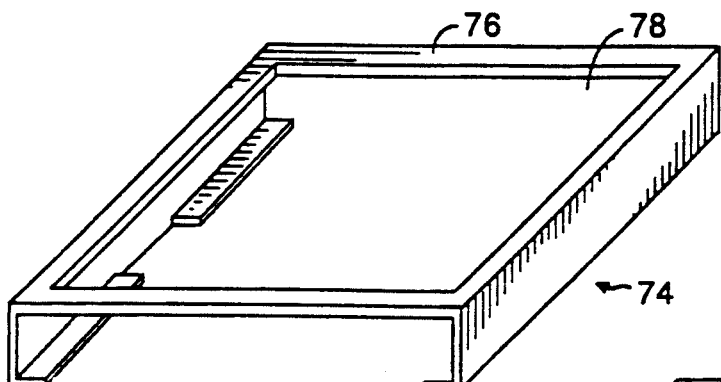
FIG. 3, FIG. 4 are alternative embodiments of springs.
Figure 4:
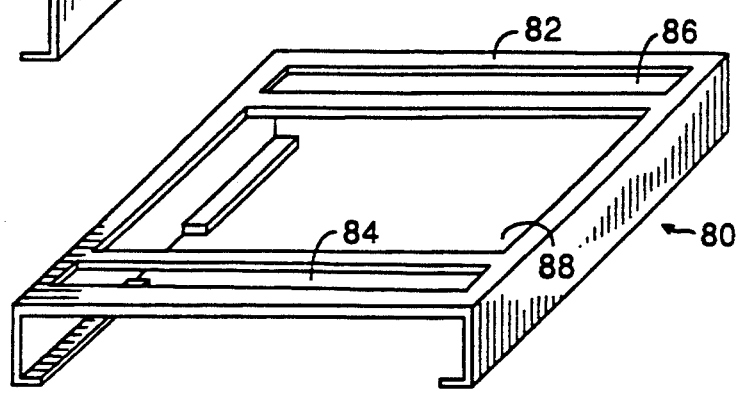

FIG. 3 and FIG. 4 are alternative embodiments of the spring 22 shown in FIG. 1. FIG. 3 shows a spring 74 which is generally U-shaped with a top 76 which is generally concave. The top 76 has a slot 78 to receive a plurality of fins 28 of the heat sink 18. The strength of force of the spring 22 may be adjusted by changing the thickness of the top 76. FIG. 4 shows a spring 80 which is generally U-shaped with a top 82 which is generally concave. The top 82 has three slots 84, 86, 88. Two of the slots 84, 86 are sized and dimensioned to receive one each of the plurality of fins 28 of the heat sink 18. The remaining slot 88 is sized and dimensioned to receive the remaining heat sink fins.

Figure 5:
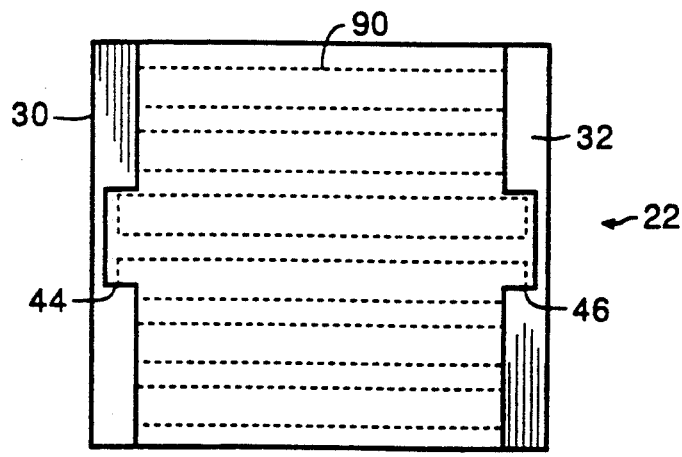
FIG. 5 is a bottom view of a spring.

FIG. 5 shows a bottom view of the spring 22 shown in FIG. 1. Each of the sides 30, 32 of the spring 22 has a gap 44, 46 for engaging with the braces 40, 42 shown in FIG. 1. Slots 90 are shown in dotted lines because the slots could be arranged as shown in FIG. 1, or FIG. 3 or FIG. 4.

Figure 6:
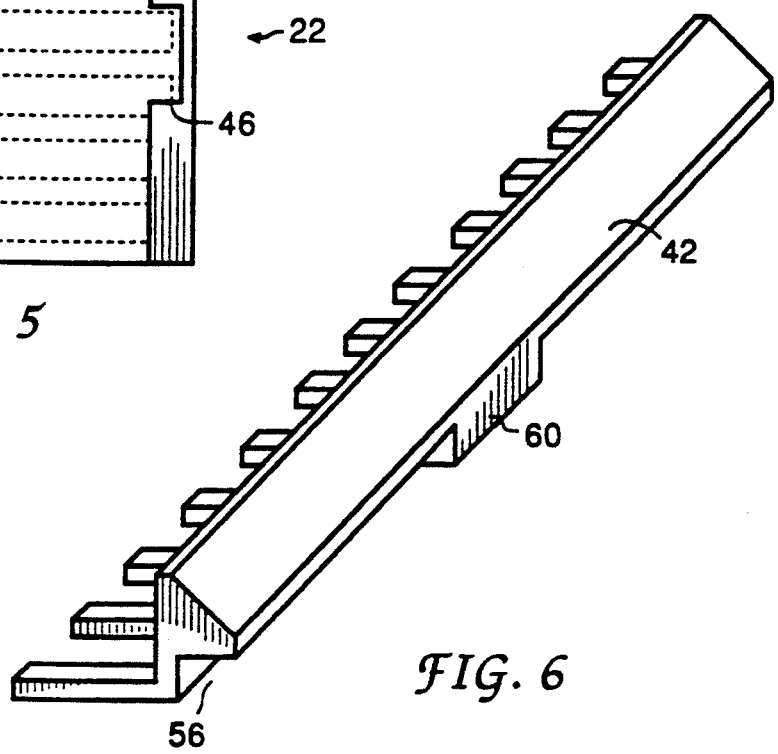
FIG. 6 is a perspective view of a brace.

FIG. 6 shows a perspective view of the brace 42 shown in FIG. 1. A groove 56 has a projection 60 which engages the spring 22 shown in FIG. 1 and prohibits slipping in a direction collinear with the brace 42.

Figure 7:
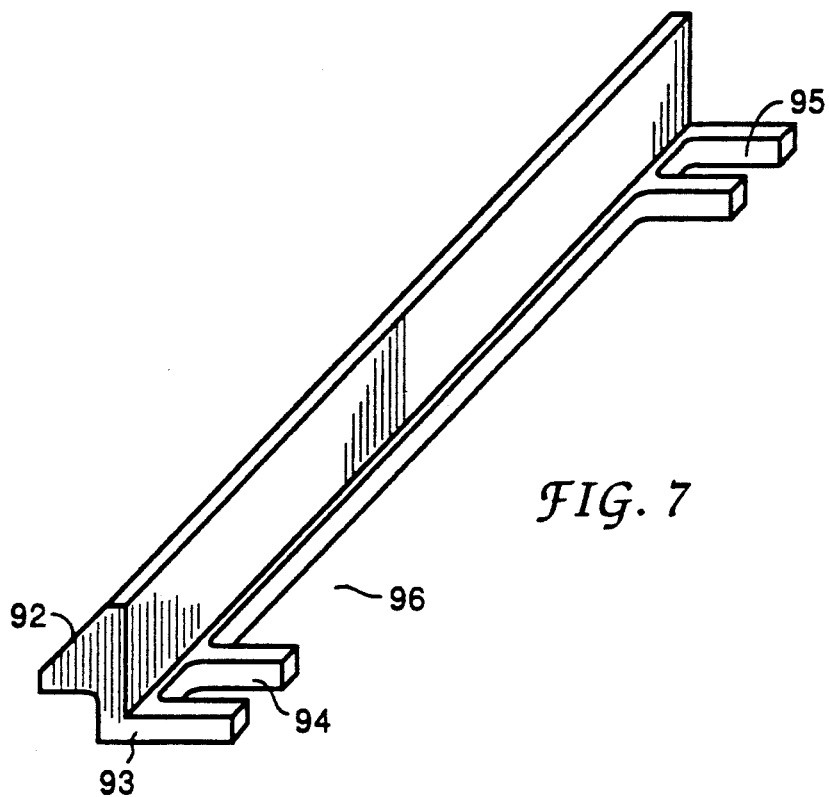
FIG. 7 is a perspective view of a brace.
Figure 8:
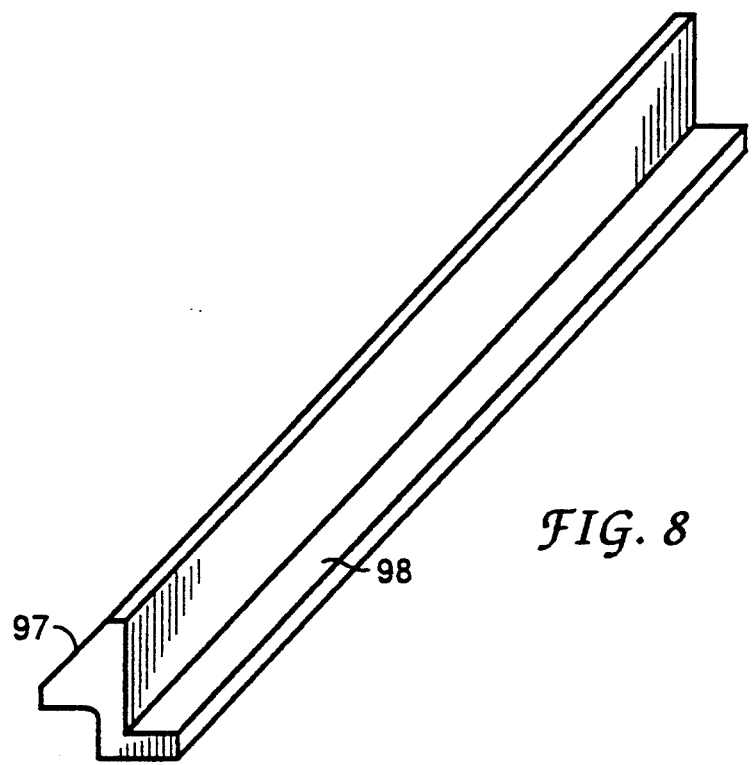
FIG. 8 is a perspective view of a brace.

FIG. 7 and FIG. 8 show perspective views of alternative embodiments of braces. FIG. 7 shows a brace 92 with a bottom plate 93 which has two small cut-outs 94, 95 and one large cut-out 96 to mesh with the pins of a chip carrier package. Other arrangements of cut-outs in the bottom plates of the braces are possible. FIG. 8 shows a brace 97 with a bottom plate 98 with no cut-outs.

Figure 9:
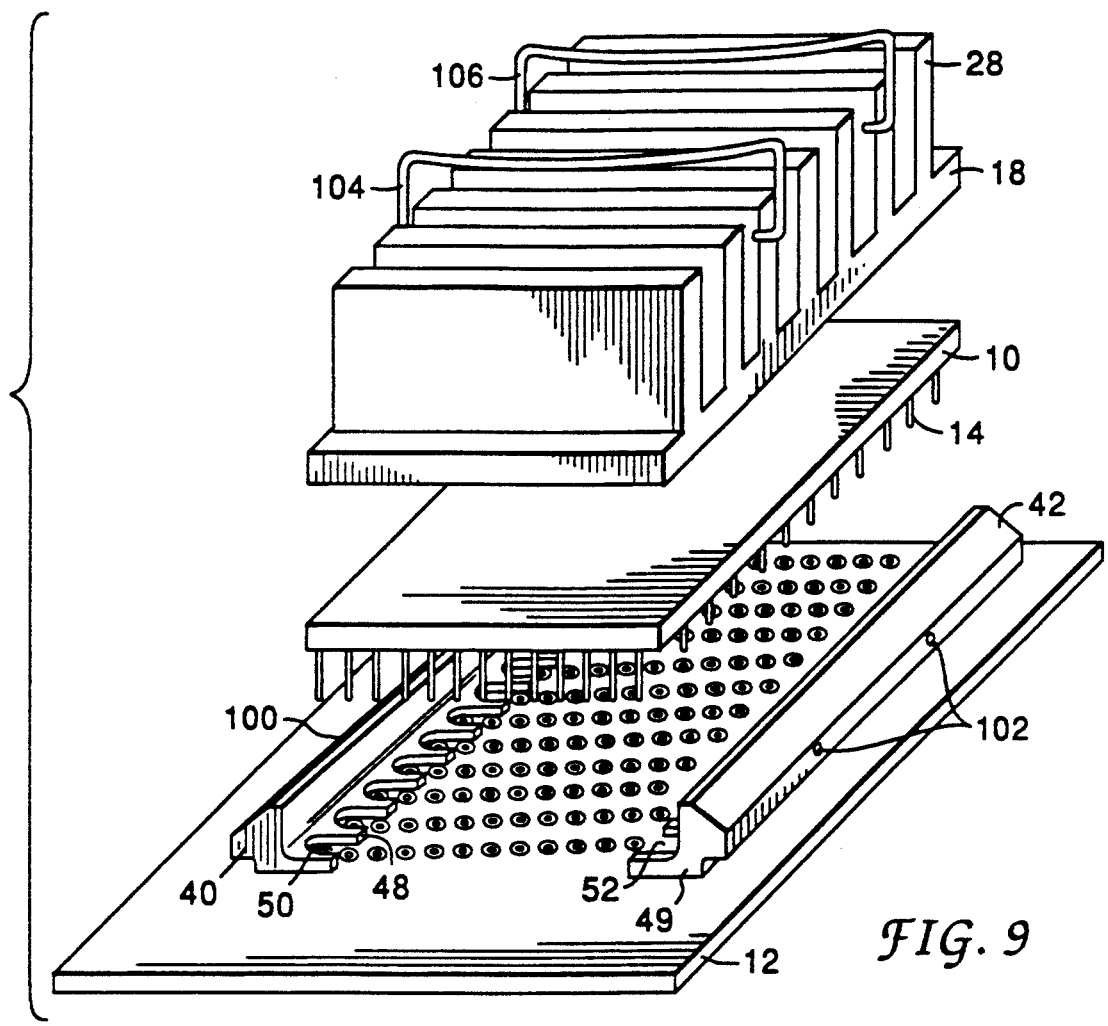
FIG. 9 is a perspective exploded view of a heat sink assembly.

FIG. 9 shows an alternative embodiment of the invention. An apparatus has a first brace 40 and a second brace 42. The braces 40, 42 have bottom plates 48, 49 for supporting a chip carrier package 10 which is mounted to substrate 12. The bottom plates have cut-outs 50, 52 to accommodate pins 14 of a chip carrier package 10. The braces 40, 42 have holes 100, 102 on an outside portion for receiving springs 104, 106. The springs 104, 106 are generally U-shaped wires sized to fit between the fins 28 of a heat sink 18, and also over the braces 40, 42 to support the chip carrier package 10.

During assembly, the braces 40, 42 are placed between the chip carrier package 10 and the substrate 12. The heat sink 18 is positioned on top of the chip carrier package 10. The springs 104, 106 are placed between the fins 28 of the heat sink 18 and inserted in the holes 100, 102 of the braces. The springs 104, 106 exert a force on the heat sink 18 while the braces support the chip carrier package 10 urging the heat sink 18 and the chip carrier package 10 together to minimize the thermal resistivity at the heat sink 18 to the chip carrier package 10 interface. The springs 104, 106 also prevent any slippage of the heat sink 18.

Figure 10:
FIG. 10, FIG. 11 and FIG. 12 are alternative embodiments of springs.
Figure 11:
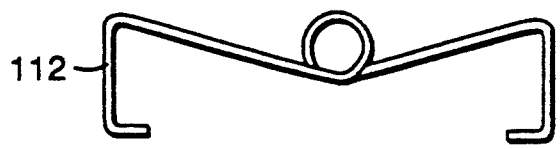
Figure 12:
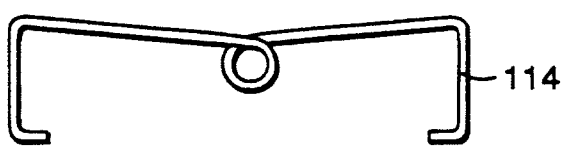

FIG. 10, FIG. 11 and FIG. 12 are alternative embodiments of the springs 104, 106 shown in FIG. 9. FIG. 10 shows a simple, generally U-shaped spring 110. FIG. 11 shows a generally U-shaped spring 112 with an upward loop at the middle of the spring. FIG. 12 shows a generally U-shaped spring 114 with a downward loop at the middle of the spring.

Figure 13:
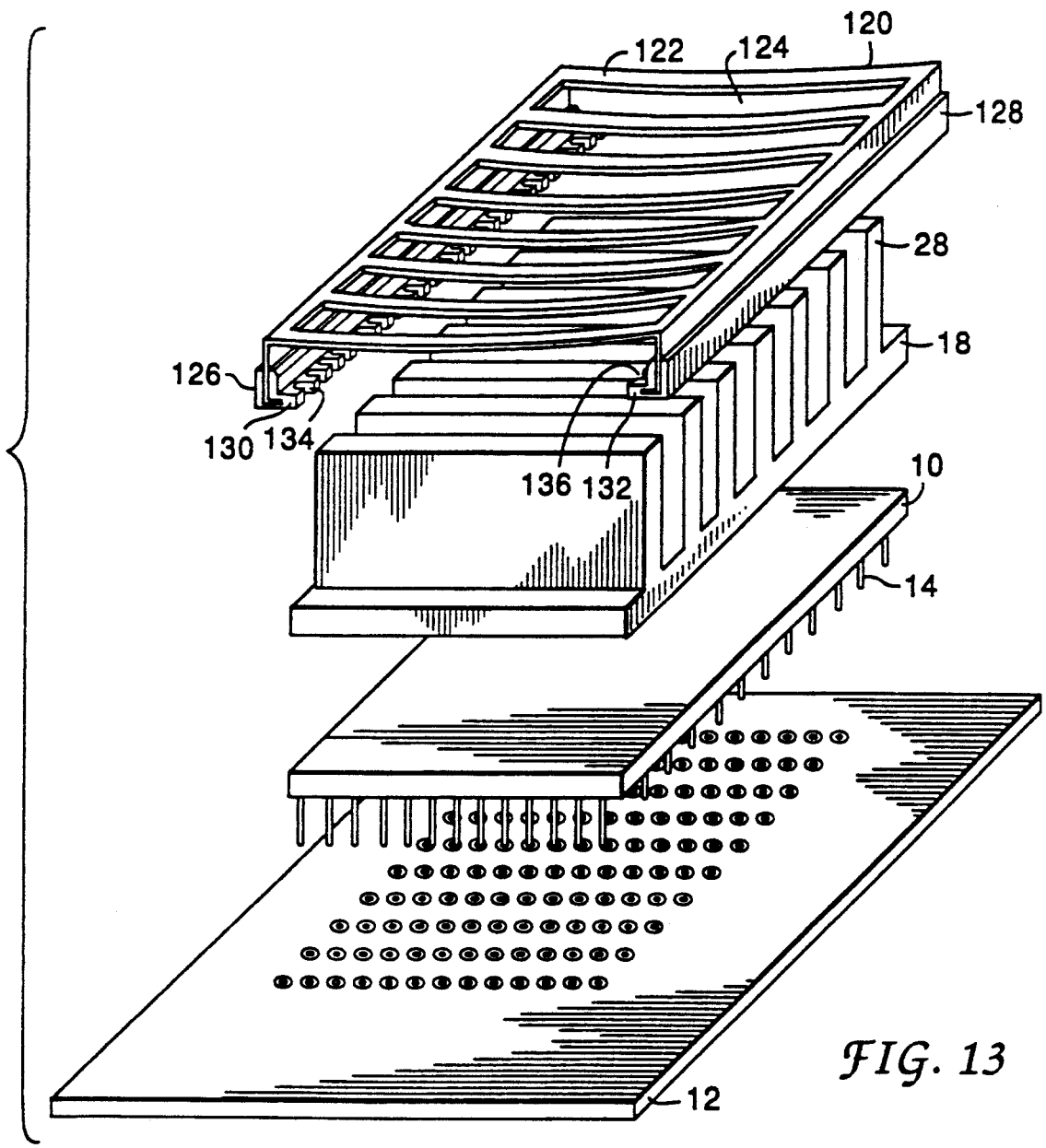
FIG. 13 is a perspective exploded view of an alternative heat sink assembly.

FIG. 13 is an alternative embodiment of a clip-on heat sink assembly. Spring 120 is generally U-shaped with a top 122 which is inwardly concave. The top 122 of the spring 120 has slots 124 to fit through fins 28 of a heat sink 18. The top 122 may have one or many slots as shown in FIGS. 1, 3 and 4. The spring 120 is embedded in a first brace 126 and a second brace 128. The braces 126, 128 have bottom plates 130, 132 for supporting a chip carrier package 10 mounted to substrate 12. The bottom plates 130, 132 have cut-outs 134, 136 to accommodate pins 14 of a chip carrier package 10. The bottom plates 130, 132 may not have a cut-out for each pin of the chip carrier package 10. There may be larger cut-outs to accommodate more pins as shown in FIG. 7. The bottom plates 130, 132 may also have no cut-outs as shown in FIG. 8. The braces 126, 128 are formed of electrically insulating material.

In assembled condition, first brace 126 is placed at one side of the chip carrier package 10 with the bottom plate 130 underneath the chip carrier package 10. The spring 120 is placed over the fins 28 of the heat sink 18 and the second brace 128 is engaged on the other side of the chip carrier package 10 by positioning the bottom plate 132 of second brace 128 underneath the chip carrier package 10.

Figure 14:
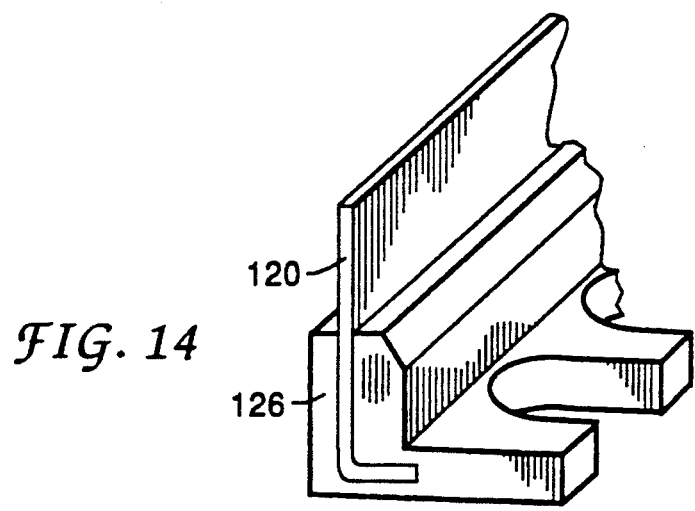
FIG. 14 is a partial perspective view of an alternative heat sink assembly.

FIG. 14 is a partial view of the spring 120 shown in FIG. 12. The spring 120 is embedded in the brace 126.

The clip-on heat sink apparatus may be adapted for socket connectors. The spring and the brace geometries of the clip-on heat sink apparatus may be adapted to various shapes of heat sinks and to heat sinks with generally horizontal fins as well as generally vertical fins. An alternative embodiment for attaching the braces is to form the braces as part of the substrate. An alternative embodiment of the braces, for providing added support to the chip carrier package, would be to place a brace under every side of the chip carrier package. A second alternative embodiment of the braces for providing added support of the chip carrier package would be to make the edge portions of the bottom plates of the braces longer to support the edges of the chip carrier package. The spring could include four sides to engage with four braces.

It is to be understood that the above-described embodiments are simply illustrative of the principles of the invention. Various and other modifications and changes may be made by those skilled in the art which will embody the principles of the invention and fall within the spirit and scope thereof.

What is claimed is:

1. An apparatus for attaching a heat transfer device to a heat generating device, comprising:

a heat generating device having pins, said heat generating device mounted on a substrate having holes receiving said pins;

a heat transfer device positioned on said heat generating device;

a spring fitting over said heat transfer device and said heat generating device; and, a first and a second brace, each said brace having a bottom plate and a means engaging said spring, said bottom plates of said first and said second braces supporting the heat generating device; said spring forcing the heat transfer device and the heat generating device together.

2. The apparatus as in claim 1, wherein the first and second brace are electrically insulating.

3. The apparatus as in claim 1, wherein said bottom plates of said first and said second braces further include cut-outs, said cut-outs numbered and arranged to receive a plurality of pins protruding from the heat generating device.

4. The apparatus as in claim 1, wherein said spring is thermally conductive.

5. The apparatus as in claim 1, wherein said spring further includes a plurality of slots to receive a plurality of fins protruding from the heat dissipating device.

6. The apparatus as in claim 1, wherein said spring is generally U-shaped in profile having a top portion and two side portions, said top portion inwardly concave, and said side portions engaging with said first and said second braces.

7. The apparatus as in claim 1, wherein said spring is attached to said first and said second brace.

8. The apparatus as in claim 1, wherein said spring is a generally U-shaped wire.

9. An apparatus as in claim 1, wherein said heat generating device is a chip.

10. An apparatus as in claim 1, wherein said substrate is a printed wiring board.

11. An apparatus for attaching a heat sink to a heat-generating electrical component comprising:

a heat-generating electrical component having a bottom with a plurality of pins protruding therefrom;

a heat sink having a width substantially equal to said electrical component, said heat sink having a heat-absorbing bottom and a heat dissipating top, said heat-dissipating top having at least one fin, said heat sink positioned so that said heat-absorbing bottom of said heat sink contacts said electrical component;

a first and a second electrically insulating brace, said first and second brace supporting said electrical component and said heat sink on opposing sides, each brace having a length substantially equal to said electrical component, each brace having a bottom plate and a groove;

a flat spring, said spring having a substantially rectangular top having a width larger than said electronic component, said rectangular top having at least one slot, said slot sized such that said at least one fin fits through, said spring having two sides, each side having a height such that said spring fits over said heat sink, said electronic component, and said first and second brace, each side being shaped such that it engages with said groove of said first and second brace, said spring bent so that it exerts a force pressing said electrical component and said heat sink together.

* * * * *